(12) United States Patent
Yuan et al.

(10) Patent No.: US 9,330,221 B2
(45) Date of Patent: May 3, 2016

(54) MASK-AWARE ROUTING AND RESULTING DEVICE

(71) Applicant: GLOBALFOUNDRIES Inc., Grand Cayman (KY)

(72) Inventors: Lei Yuan, Cupertino, CA (US); Jongwook Kye, Pleasanton, CA (US); Harry J. Levinson, Saratoga, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 53 days.

(21) Appl. No.: 14/286,395

(22) Filed: May 23, 2014

(65) Prior Publication Data
US 2015/0339428 A1    Nov. 26, 2015

(51) Int. Cl.
*G06F 17/50* (2006.01)
(52) U.S. Cl.
CPC ........ *G06F 17/5077* (2013.01); *G06F 17/5081* (2013.01)

(58) Field of Classification Search
CPC ............... H01L 27/1104; H01L 27/11807; H01L 27/0922; G06F 17/5077; G06F 17/5072; G06F 17/5081; G11C 5/025; G11C 5/063
USPC .......................................................... 716/50–56
See application file for complete search history.

(56) References Cited

U.S. PATENT DOCUMENTS

| 7,065,729 B1* | 6/2006 | Chapman ............ G06F 17/5077 716/129 |
| 2014/0259658 A1* | 9/2014 | Hsu ..................... H05K 3/0082 29/847 |
| 2014/0282287 A1* | 9/2014 | Hsu .......................... G03F 1/70 716/51 |

* cited by examiner

*Primary Examiner* — Binh Tat
(74) *Attorney, Agent, or Firm* — Ditthavong & Steiner, P.C.

(57) ABSTRACT

Methods for routing a metal routing layer based on mask design rules and the resulting devices are disclosed. Embodiments may include laying-out continuous metal lines in a semiconductor design layout, and routing, by a processor, a metal routing layer using the continuous metal lines according to placement of cut or block masks based on cut or block mask design rules.

15 Claims, 13 Drawing Sheets

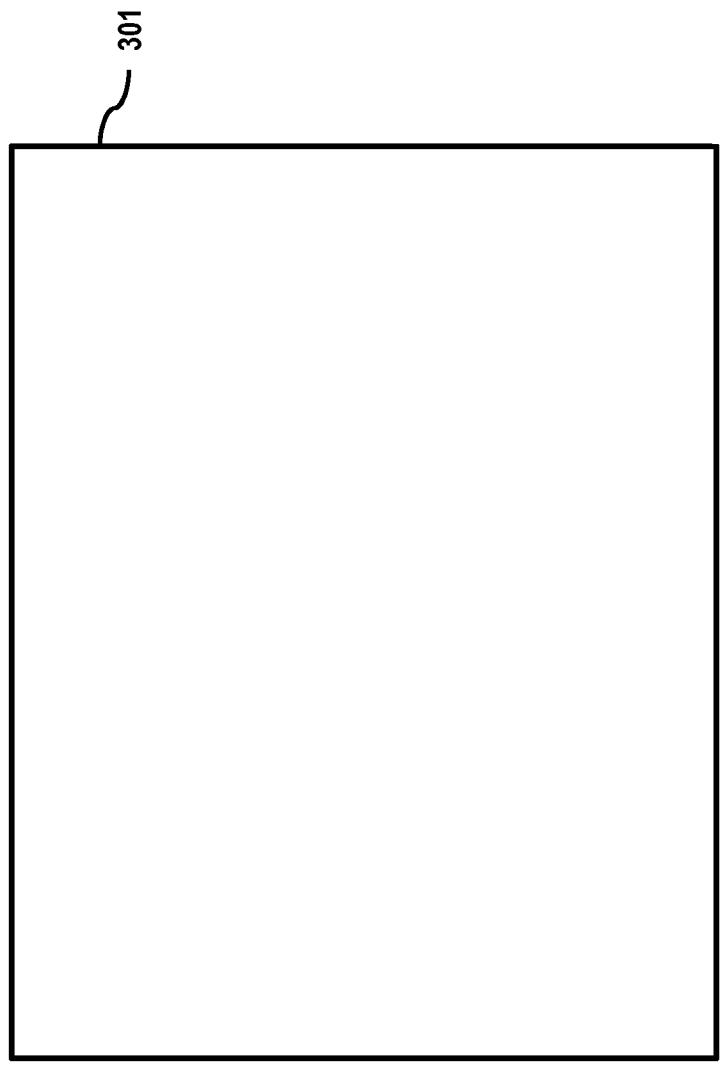

MASK-AWARE ROUTING AND RESULTING DEVICE

TECHNICAL FIELD

The present disclosure relates to metal routing layers. The present disclosure is particularly applicable to generating metal routing layers for 10 nanometer (nm) technology nodes and beyond.

BACKGROUND

Multiple patterning technologies include lithography-etch/lithography-etch (LELE), self-aligned double patterning (SADP), self-aligned quadruple patterning (SAQP), directed self-assembly (DSA), etc. In SADP and SAQP, masks, such as cut masks or block masks, are applied to generate line ends. For simplicity, the focus in this disclosure is on cut masks, but the masks can be cut masks and/or block masks. SADP and SAQP are preferred solutions for advanced metal routing because there is no overlay error generated compared to LELE.

Electronic design automation (EDA) routing tools generate designs of metal lines to connect cells within an integrated circuit, forming a metal routing layer. The routing tools use metal line design rule checks to ensure that the metal routing layer does not violate any design rules.

Challenges exist in using SADP and/or SAQP for forming the metal routing layer. A separate post-routing decomposition tool is required to generate the cut mask for generating the ends of the continuous metal lines. That is, the routing tool is not aware of mask design rules for forming the cut mask. Typically, there are design rule check errors associated with the cut mask, which requires repeating the routing process. Such an iterative process delays design closure. Further, it is not intuitive to modify metal lines according to cut mask design rule errors. Further, because routing tools are not aware of the cut mask required to form the metal routing layer, the routing tools typically generate metal routing layers that require complex mask geometries that are prohibitively complex for manufacturing. Thus, additional post-routing tools are required to optimize the cut mask, which requires extending the designed metal lines of the metal routing layer to reduce the complexity of the mask geometries as well as adding dummy metal fill extensively, both of which are not included within the designed route timing closure.

A need, therefore, exists for cut-mask-aware routing in designing a metal routing layer, and the resulting devices formed based on the cut-mask-aware routing.

SUMMARY

An aspect of the present disclosure is a new routing method that first lays out continuous metals lines and then inserts a cut mask to generate signal metal lines to connect cells, where the non-signal metal lines become metal fill.

An aspect of the present disclosure is a method for designing a metal routing layer based on cut mask design rules.

Another aspect of the present disclosure is an apparatus that performs cut-mask-aware routing of a metal routing layer.

Another aspect of the present disclosure is a device including a metal routing layer formed based on cut-mask-aware routing.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: laying-out continuous metal lines in a semiconductor design layout; and routing, by a processor, a metal routing layer using the continuous metal lines according to placement of cut or block masks based on cut or block mask design rules.

An aspect of the present disclosure includes portions of the continuous metal lines used in the metal routing layer forming signal lines, and remaining portions of the continuous metal lines forming dummy lines. Further aspects of the routing include determining locations of cut or block masks to generate the signal lines from the continuous metal lines to connect cells within the semiconductor design layout, and checking whether the placement of the cut or block masks satisfies the cut mask design rules. A further aspect includes accounting for timing delays resulting from the signal lines during the routing. Yet another aspect includes accounting for timing delays resulting from the dummy lines during the routing to generate a dummy-line-aware timing closure. An additional aspect includes determining that two candidate cut or block mask polygons for routing the metal routing layer would violate the cut or block mask design rules, and combining the two candidate cut or block mask polygons into a single cut or block mask polygon to satisfy the cut or block mask design rules. Another aspect includes the cut or block mask design rules being based on proximity of the two candidate cut or block mask polygons. Yet another aspect includes the masks being block masks. Still another aspect includes the masks being cut masks.

Another aspect of the present disclosure is an apparatus including: a processor; and a memory including computer program code for one or more programs, the memory and the computer program code configured to, with the processor, cause the apparatus to perform the following: layout continuous metal lines in a semiconductor design layout; and route a metal routing layer using the continuous metal lines according to placement of cut or block masks based on cut or block mask design rules.

Aspects include the portions of the continuous metal lines used in the metal routing layer forming signal lines, and remaining portions of the continuous metal lines forming dummy lines. Another aspect includes the apparatus being further caused, with respect to routing the metal layer, to determine locations of cut or block masks to generate the signal lines from the continuous metal lines to connect cells within the semiconductor design layout, and check whether the placement of the cut or block masks satisfies the cut or block mask design rules. Still another aspect includes the apparatus being further caused to account for timing delays resulting from the signal lines during the routing. An additional aspect includes the apparatus being further caused to account for timing delays resulting from the dummy lines during the routing to generate a dummy-line-aware timing closure. A further aspect includes the apparatus being further caused to determine that two candidate cut or block mask polygons for routing the metal routing layer would violate the cut or block mask design rules, and combine the two candidate cut or block mask polygons into a single cut or block mask polygon to satisfy the cut or block mask design rules. Another aspect includes the cut or block mask design rules being based on proximity of the two candidate cut or block mask polygons. Yet another aspect includes the masks being block masks. An additional aspect includes the masks being cut masks.

According to the present disclosure, additional technical effects may be achieved in part by a method including: forming continuous metal lines above a substrate of a semiconductor device, determining locations of cut or block masks based on cut or block mask design rules for designing a metal routing layer out of the continuous metal lines, and removing portions of the continuous metal lines based on the cut or block masks forming the metal routing layer. Additional aspects include determining that two candidate cut or block mask polygons in designing the metal routing layer would violate a cut or block mask design rule, and forming a single cut or block mask polygon by combining the two candidate cut or block mask polygons to satisfy the cut or block mask design rule.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 3A through 3D schematically illustrate a method for forming a metal routing layer, according to an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1A:
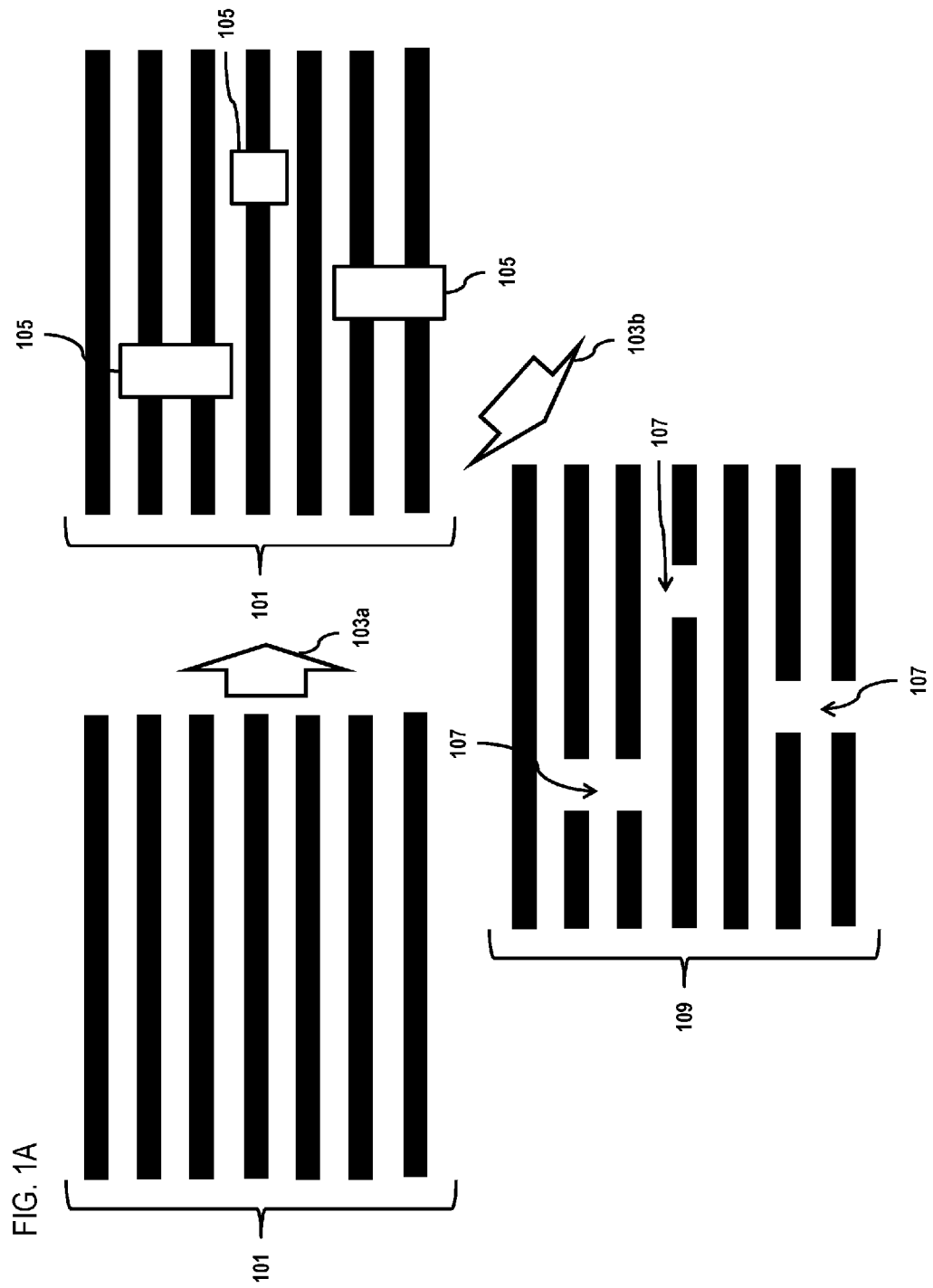
FIG. 1A illustrates a cut patterning layout by applying cut masks to continuous metal lines, according to an exemplary embodiment.

FIG. 1A illustrates a cut patterning layout applying cut masks to continuous metal lines, according to an exemplary embodiment. Forming a metal routing layer begins with continuous metal lines 101. Depending on the technology node of the resulting semiconductor device, the continuous metal lines 101 can be very dense. The flow of the cut patterning proceeds, as indicated by arrow 103a, to applying cut masks 105 to the continuous metal lines 101. After applying the cut masks 105, the flow of the cut patterning proceeds, as indicated by arrow 103b, to removing portions of the continuous metal lines 101 where the cut masks 105 are applied, forming spaces 107 in the continuous metal lines 101. As a result, the continuous metal lines 101 are patterned according to the spaces 107 to form patterned metal lines 109 that constitute the metal routing layer.

Figure 1B:
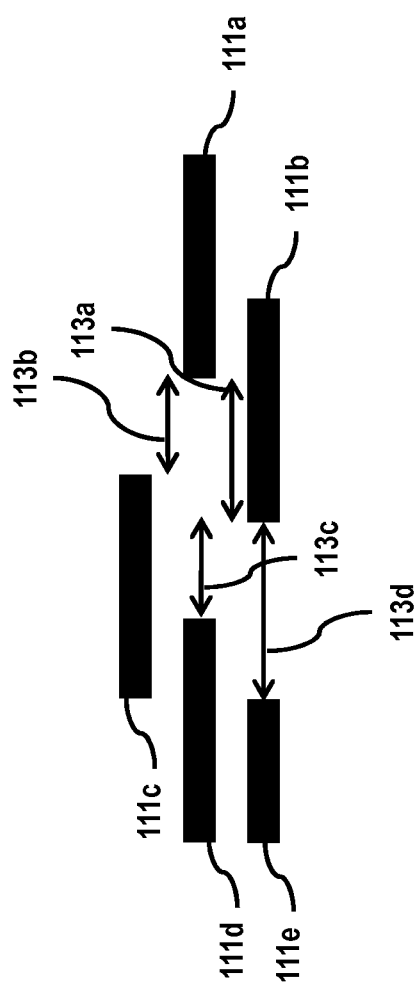
FIGS. 1B and 1C illustrate differences between metal line design rule checks and cut mask design rule checks, according to an exemplary embodiment.

FIG. 1B illustrates a metal line design rule check used in routing a metal routing layer, according to an exemplary embodiment. The metal lines 111a through 111e represent the metal lines within a design for a metal routing layer as initially created by a routing tool based on metal line design rules. Distances 113a through 113d represent the various distances between the metal lines 111a through 111e. To ensure that the metal lines 111a through 111e satisfy metal line design rules, distances 113a through 113d must satisfy certain thresholds, such as being greater than a certain value as defined by limitations in the manufacturing of the metal routing layer.

Conventionally, in routing a metal routing layer, such as by a routing tool, the routing tool generates metal lines 111a through 111e that satisfy the metal line design rules. After generating the metal lines 111a through 111e, the metal lines 111a through 111e are mapped to continuous metal lines for forming the metal routing layer, as described with respect to FIG. 1A. The metal lines 111a through 111e are decomposed by a separate EDA tool to generate the cut masks required to form ends of the continuous metal lines for forming the metal lines 111a through 111e. As discussed below, also generated are metal fill and metal extension to reduce the complexity of the resulted cut mask shapes.

Figure 1C:
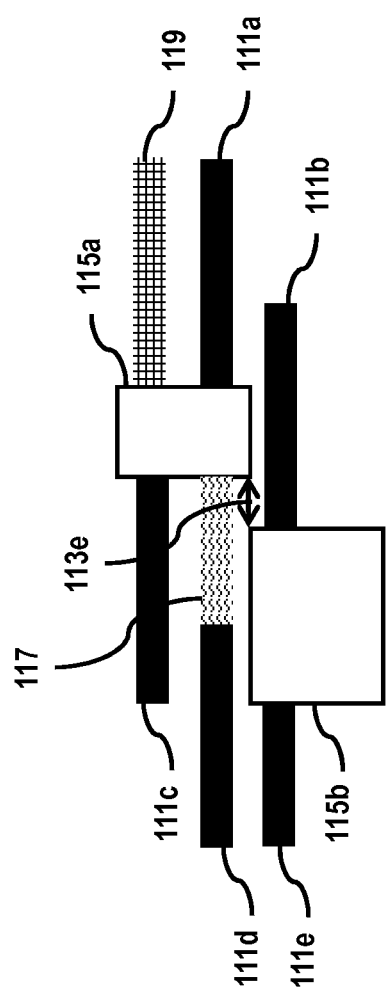

FIG. 1C illustrates exemplary masks 115a and 115b that are generated after decomposing the metal lines 111a through 111e by the separate post-routing decomposition tool. The cut masks 115a and 115b are a distance 113e apart. The masks 115a and 115b must satisfy cut mask design rules. Accordingly, the distance 113e must satisfy certain thresholds, such as being greater than a certain value as defined by limitations in the manufacturing of the resulting cut mask. Although the distances 113a through 113d may satisfy the metal line design rules, the distance 113e may violate cut mask design rules. Because the routing tool that designed the metal lines 111a through 111e is not aware of the cut mask design rules, the routing tool in unable to accommodate the cut mask design rules or generate metal lines 111a through 111e that will also result in decomposed cut masks that satisfy cut mask design rules. Thus, the design illustrated in FIGS. 1B and 1C is not manufacturable because of the violation of the cut mask design rules. An iterative process is required for the routing tool to re-design the metal lines 111a through 111e until a metal routing layer is designed that ultimately also satisfies the cut mask design rules.

In addition, because the routing tool does not consider that the metal lines 111a through 111e are applied to continuous metal lines (e.g., continuous metal lines 101) when the metal lines 111a through 111e are formed, the routing tool does not consider metal extensions and/or metal fills that are needed to form the metal routing layer. For example, a post-routing decomposition tool will generate metal extension 117 and metal fill 119, as shown in FIG. 1C, which are portions of the continuous metal lines that are required only to reduce the complexity of the cut masks that are needed to pattern the continuous metal lines into the metal lines of the metal routing layer. The resulting metal extension 117 and metal fill 119 change the timing performance of the routed design, which cannot be modeled by the routing tool.

The present disclosure addresses and solves the current problem of cut mask design rule violations and un-predictable design timing results attendant upon forming metal routing layers based on metal line design rules. In accordance with embodiments of the present disclosure, routing of a metal routing layer is directly based on cut mask design rules considering continuous metal lines, allowing for a design flow that coincides with the manufacture flow of the metal routing layer.

Methodology in accordance with an embodiment of the present disclosure includes laying-out continuous metal lines in a semiconductor design layout. The methodology further includes routing, by a processor, a metal routing layer using the continuous metal lines according to placement of cut masks based on cut mask design rules.

Figure 2A:
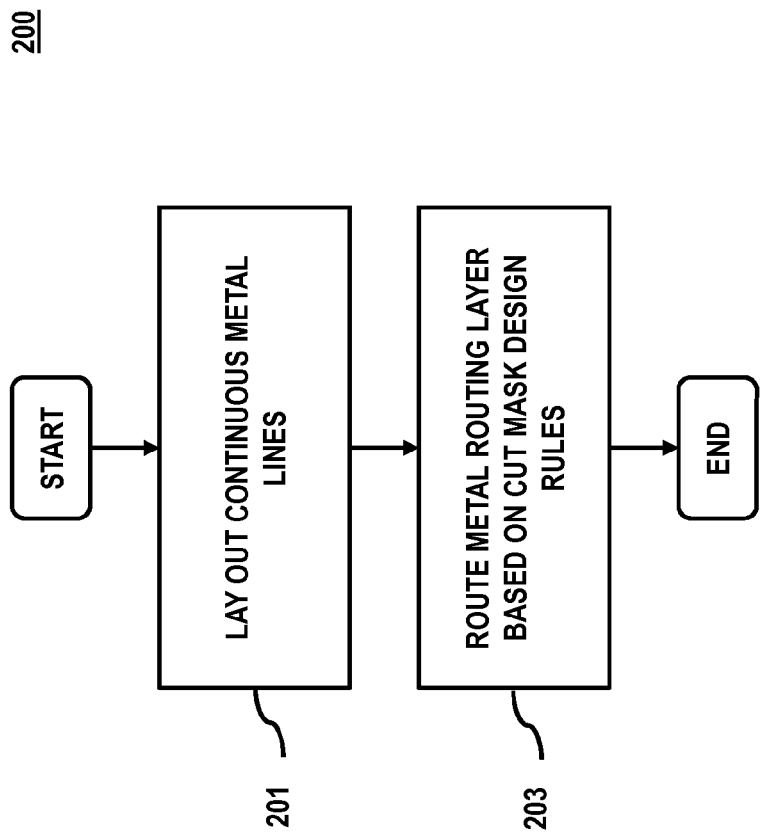
FIG. 2A illustrates is a flowchart of a process for routing a metal routing layer based on cut mask design rules, according to an exemplary embodiment.

FIG. 2A is a flowchart of a process 200 for routing a metal routing layer based on cut mask design rules, according to an exemplary embodiment. The process 200 may be performed by a routing tool, which may be embodied by the exemplary hardware illustrated and described with respect to FIG. 5. At step 201, the routing tool lays-out continuous metal lines within a layer of a semiconductor design layout that will constitute a metal routing layer of a semiconductor device upon completion. As understood in the art, the metal routing layer will electrically connect the various logic elements of a semiconductor device together. The continuous metal lines may be at a certain pitch and width as required for the semiconductor design layout.

At step 203, the routing tool routes a metal routing layer using the continuous metal lines according to placement of cut masks based on cut mask design rules. Thus, unlike conventional routing that relies on metal line design rules, the routing of step 203 relies directly on cut mask design rules for routing the metal routing layer. The routing generates cut masks at certain locations of the continuous metal lines to separate the continuous metal lines into signal lines and dummy lines. The signal lines form the metal routing layer, providing the routing to connect the logic elements of the resulting semiconductor device. The dummy lines remain as a result of beginning with the continuous metal lines in the design of the metal routing layer. The routing tool at step 203 uses a tech file that includes cut mask design rules for determining the placement of the cut masks on top of the continuous metal lines. The tech file can also include a limited variation of cut mask patterns to simplify the cut masks that are used in forming the metal routing layer. The limited cut mask patterns may vary based on shape and size. The limited variation of mask patterns that can be used automatically controls the complexity of the cut masks such that additional post-routing tools are not required to reduce the complexity of the cut masks.

Accordingly, by designing the metal routing layer directly based on the cut mask design rules, the routing tool forms a metal routing layer that will not subsequently cause cut mask design rule violations after the metal routing layer is decomposed to generate the cut masks. Indeed, the approach of process 200 eliminates the need to decompose the metal routing layer to generate the cut masks because the metal routing layer is directly defined based on the cut masks. Further, the approach of process 200 automatically determines the signal lines and the dummy lines such that the timing of the metal routing layer is dummy-line-aware and does not require additional post-routing tools to add additional dummy lines.

Figure 2B:
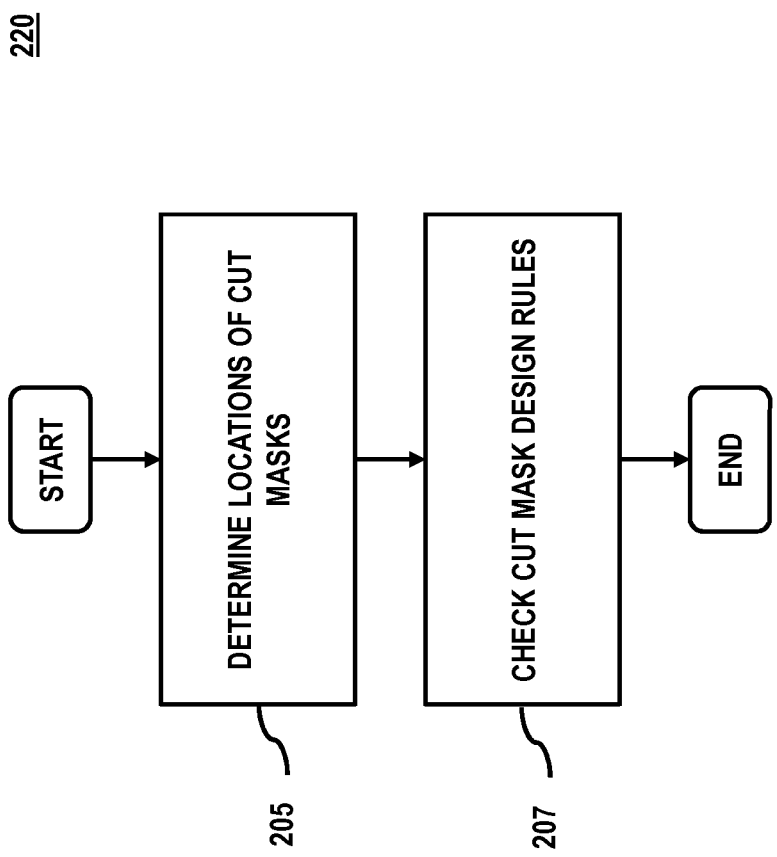
FIG. 2B is a flowchart of a process for determining locations of cut masks in routing a metal routing layer based on cut mask design rules, according to an exemplary embodiment.

FIG. 2B is a flowchart of a process 220 for determining locations of cut masks in routing a metal routing layer based on cut mask design rules, according to an exemplary embodiment. The process 220 may be performed by a routing tool, which may be embodied by the exemplary hardware illustrated and described with respect to FIG. 5. At step 205, the routing tool determines how to separate the continuous metal lines into signal lines and dummy lines to connect logic elements by the signal lines. The routing tool may determine the locations and lengths of the signal lines corresponding to locations along the continuous metal lines for connecting logic elements of a semiconductor design layout. Based on the locations and lengths of the signal lines, the routing tool determines locations of cut masks to generate the signal lines from the continuous metal lines. The routing tool can determine locations of cut masks to separate the continuous metal lines into the signal lines, for forming the metal routing layer, and the dummy lines. In determining the locations of the cut masks, the routing tool can use the route tech file that includes the limited number of cut mask patterns for separating the continuous metal lines into the signal lines and the dummy lines.

After determining the locations of the cut masks, at step 207, the routing tool checks whether the placement of the cut masks satisfies cut mask design rules. The cut mask design rules can be included in the route tech file. If there are any mask design rule errors, the routing tool can modify the placement of the cut masks, the shapes of the cut masks, or both to satisfy the cut mask design rules, such as by moving a cut mask polygon to satisfy a minimum distance between two cut mask polygons. Although discussed as two separate steps, the steps 205 and 207 of process 220 can effectively occur simultaneously such that a cut mask is not placed into a position that causes a cut mask design rule error.

Figure 2C:
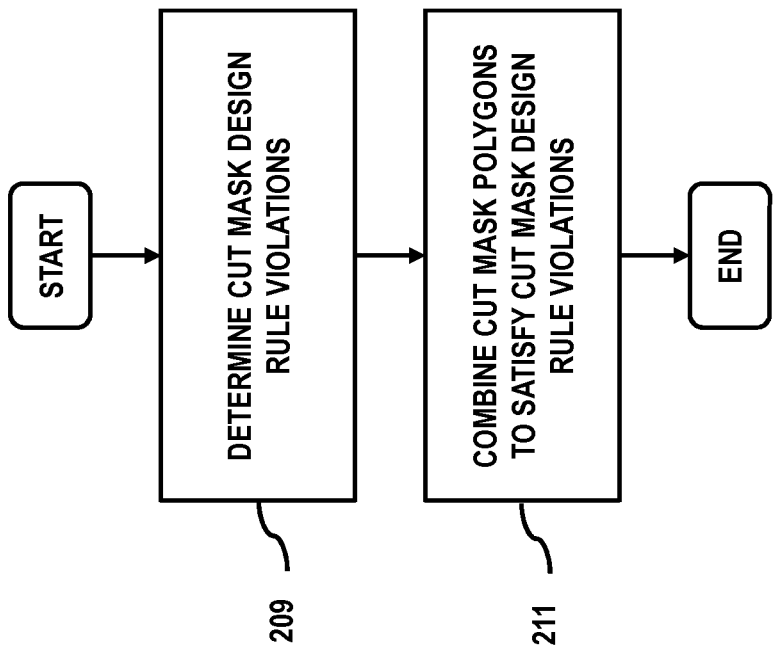
FIG. 2C is a flowchart of a process for satisfying a design rule violation, according to an exemplary embodiment.

FIG. 2C is a flowchart of a specific process 240 for correcting a mask design rule violation, according to an exemplary embodiment. The process 240 may be performed by a routing tool, which may be embodied by the exemplary hardware illustrated and described with respect to FIG. 5. At step 209, the routing tool determines that two cut mask polygons, which can be referred to as candidate cut mask polygons because they are not yet defined as final cut masks used in forming the metal routing layer, would violate a cut mask design rule. The two candidate polygons may violate the cut mask design rule because they are too close. Such a determination may occur after placing the second candidate cut mask polygon near the first candidate cut mask polygon, which would otherwise cause a cut mask design rule error.

At step 211, the routing tool combines the two candidate cut mask polygons into a single polygon to satisfy the cut mask design rule. To maintain the simplicity of the resulting polygon, metal extension, metal fill, or both need be inserted. However, the correction of step 211 is merely exemplary, and the cut mask design rule error may be corrected according to other modifications of the cut masks, such as removing a cut mask polygon, moving a cut mask polygon, etc.

Adverting to FIG. 3A, a method for forming a metal routing layer, according to an exemplary embodiment, begins with a semiconductor device 301 during manufacturing. Although not shown (for illustrative convenience), the semiconductor device 301 includes logic elements, so called standard cells, that require connecting to make the semiconductor device 301 operational. Thus, at FIG. 3A, the semiconductor device 301 is at a stage of manufacturing for forming a metal routing layer to connect the logic elements.

Figure 3B:
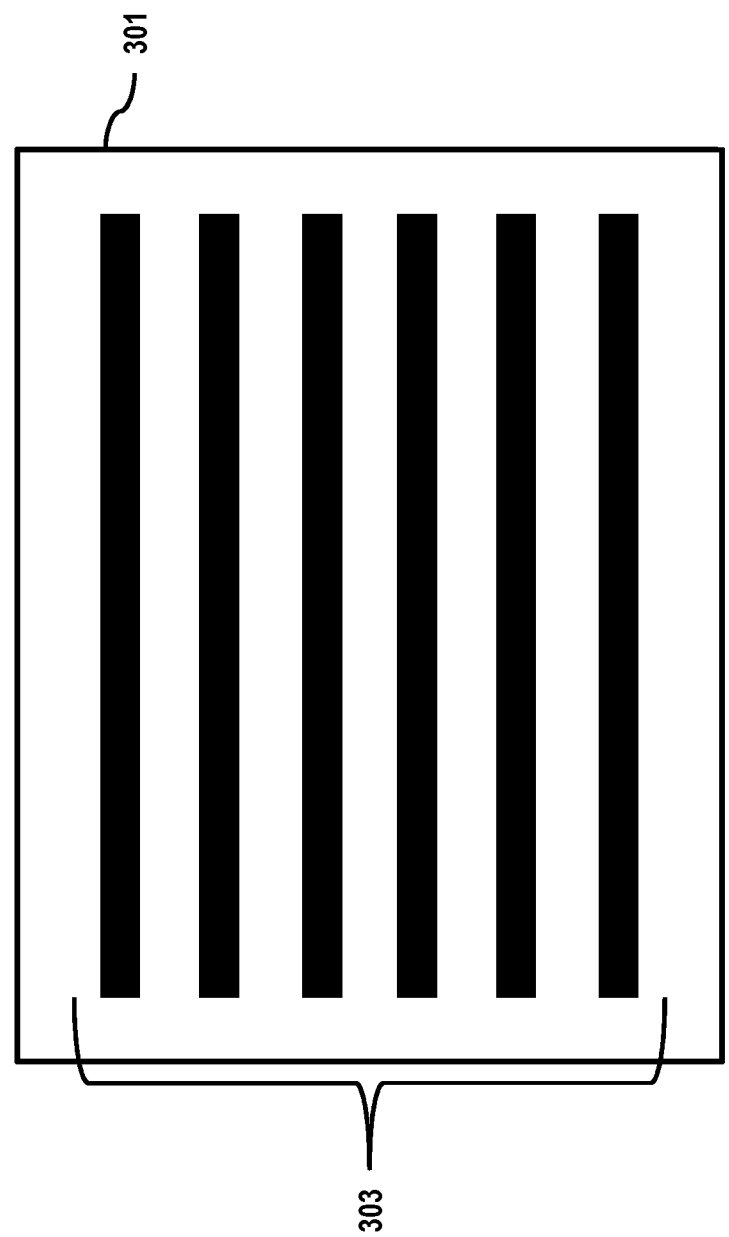

Continuous metal lines 303 are formed over the semiconductor device 301, as illustrated in FIG. 3B. The continuous metal lines 303 may be formed of a conductor, such as copper, at a specific pitch, according to the requirements of the design of the semiconductor device 301. As discussed above, for technology nodes of 10 nm and below, the continuous metal lines 303 may be formed according to SADP, SAQP, DSA, etc.

Figure 3C:
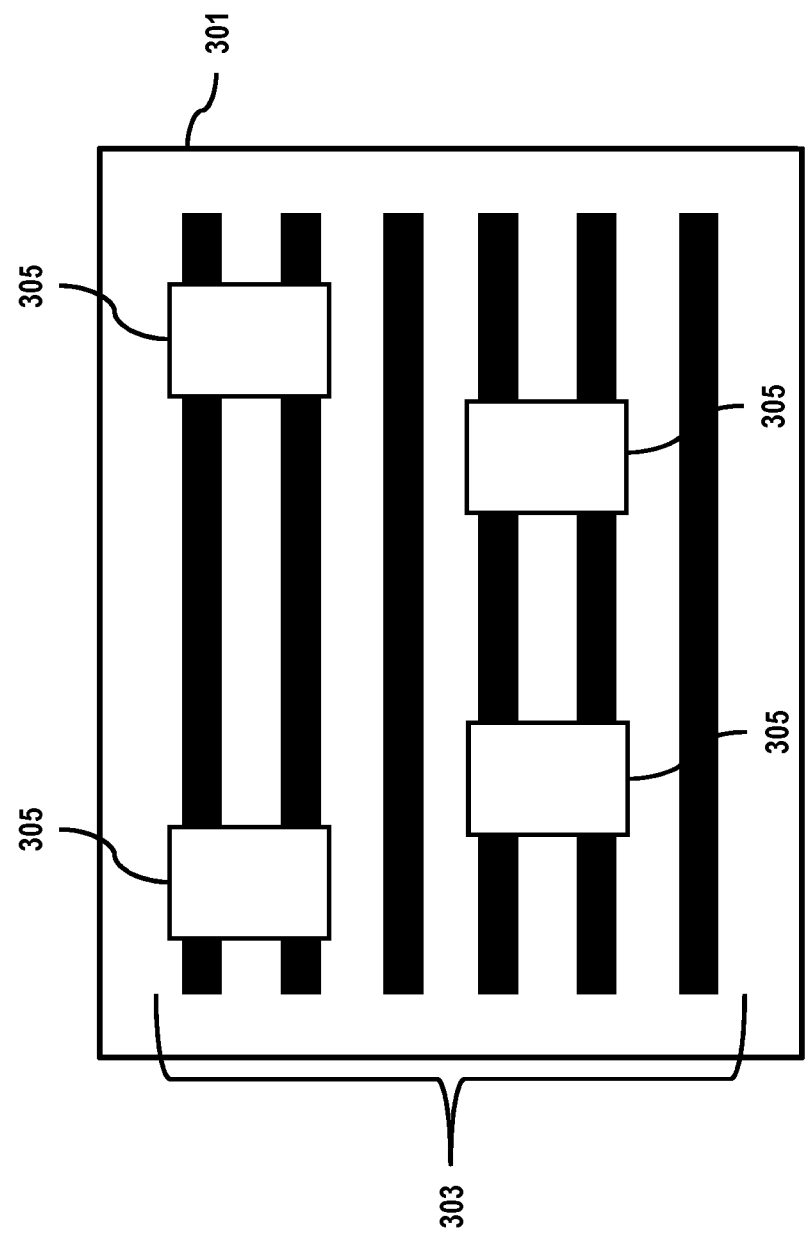

Adverting to FIG. 3C, cut masks 305 are placed at locations within the continuous metal lines 303, as determined by a routing tool, to generate a metal routing layer. As described above, the cut masks 305 are placed according to a cut-mask-aware routing for generating the metal routing layer. Further, as described above, the cut masks 305 may alternatively be block masks. Further, although referred to individually, cut masks 305 may be considered one single cut mask or separate distinct cut masks.

Figure 3D:
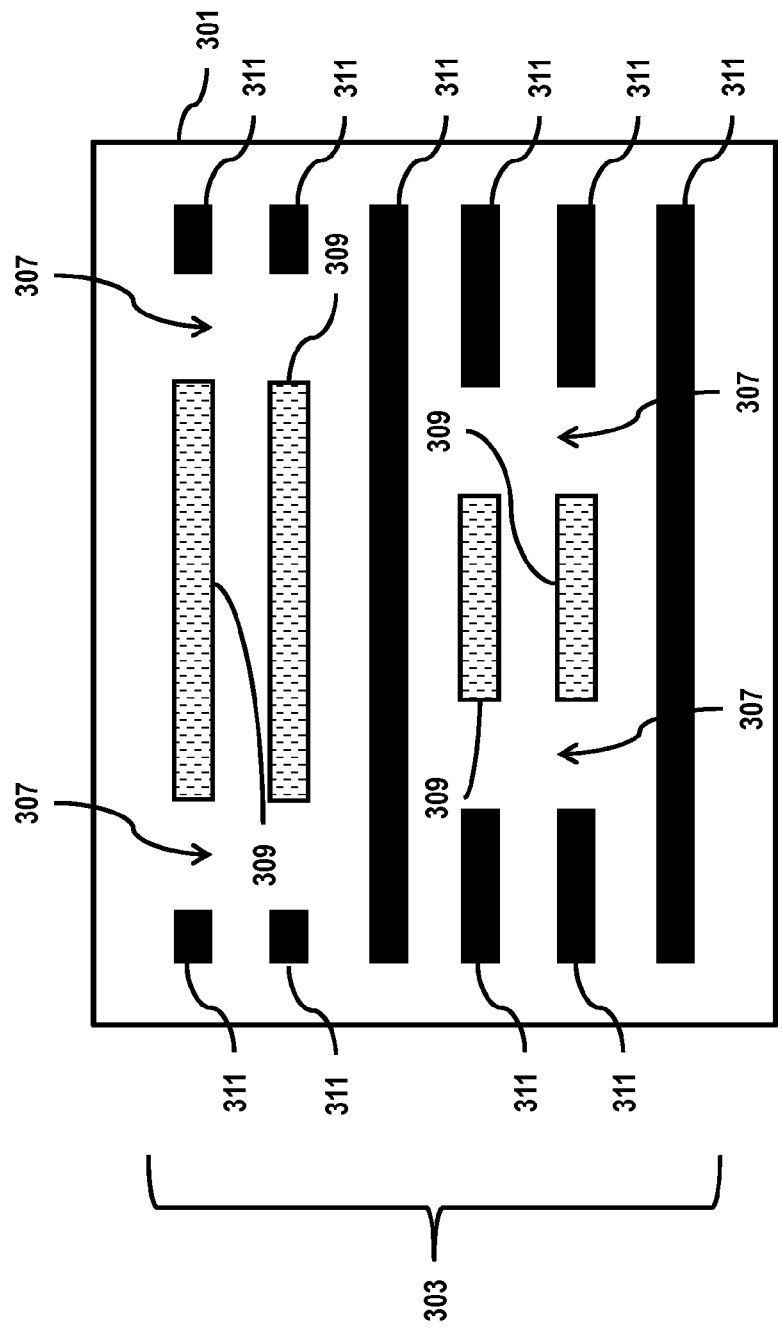

The continuous metal lines 303 and the cut masks 305 are processed to form gaps 307 within the continuous metal lines 303, as illustrated in FIG. 3D. The gaps 307 isolate portions of the continuous metal lines 303 to form signal lines 309 that connect the logic elements within the semiconductor device 301 and constitute a metal routing layer. The remaining continuous metal lines 303 that do not constitute signal lines 309 constitute dummy lines 311. Because the cut masks 305 are directly determined and placed by the routing tool, the routing tool is aware of the portions of the continuous metal lines 303 that form the signal lines 309 and that form the dummy lines 311. Thus, the dummy lines 311 are generated automatically and do not require additional post-routing dummy line insertion that is conventionally required for reducing the complexity of cut masks required to form a metal routing layer that is designed according to metal line design rules. Accordingly, the routing tool is able to form a dummy-line-aware timing closure for the metal routing layer.

Figure 4A:
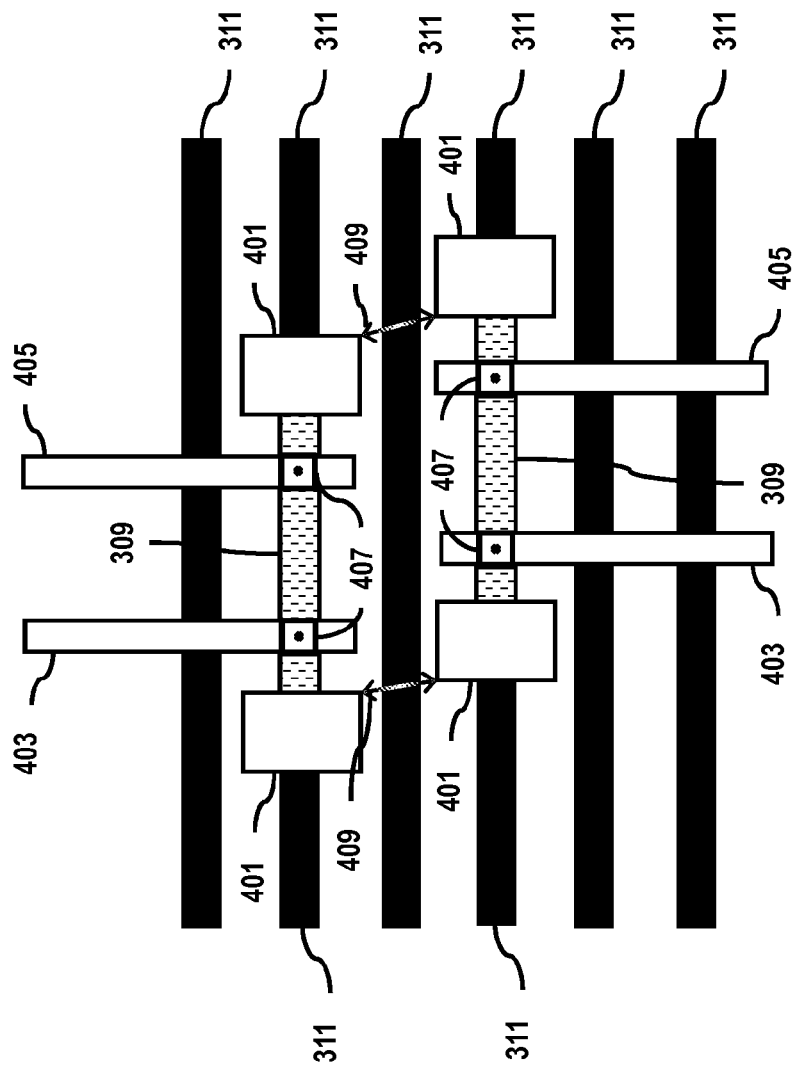
FIG. 4A schematically illustrates a semiconductor design that satisfies a cut mask design rule check, according to an exemplary embodiment.

FIG. 4A illustrates a semiconductor design at the metal routing layer that satisfies a cut mask design rule, according to an exemplary embodiment. Specifically, the metal routing layer includes signal lines 309 and dummy lines 311 formed according to the process illustrated in FIGS. 3A through 3D. However, the signal lines 309 are separated from the dummy lines 311 according to cut masks 401 that remove portions of continuous metal lines. Input lines 403 and output lines 405 feed signals to the signal lines 309 and are connected by vertical interconnect accesses (VIAs) 407. Although the signal lines 309 are illustrated as connected to an input line 403 and an output line 405, depending on the routing of the metal routing layer, the signal lines 309 may connect to only an input line 403, only an output line 405, etc.

As illustrated by arrows 409, the distances between nearest cut masks 401 satisfy the mask design rules. Accordingly, the metal routing layer formed according to the cut masks 401 separating the signal lines 309 from the dummy lines 311 can be manufactured.

Figure 4B:
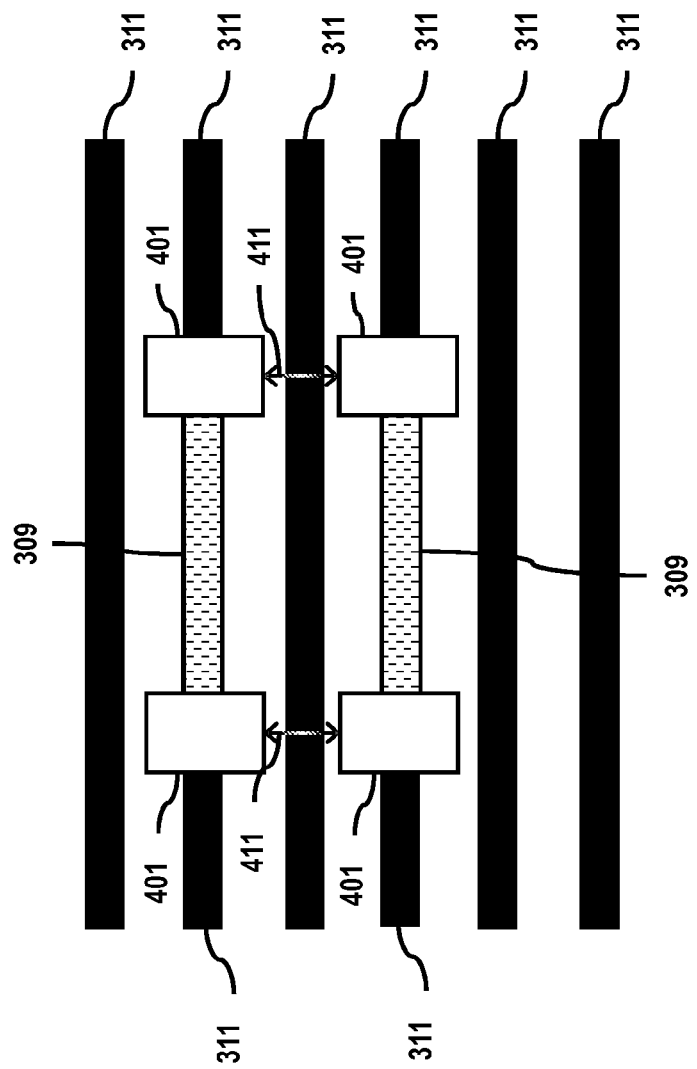
FIGS. 4B through 4C schematically illustrate a correction of a cut mask design rule violation, according to an exemplary embodiment.

FIG. 4B illustrates a semiconductor design at the metal routing layer that does not satisfy a cut mask design rule, according to an exemplary embodiment. The configuration in FIG. 4B is similar to that of FIG. 4A; however, the lower signal line 309 and cut masks 401 are shifted to the left. The shift causes a cut mask design rule violation because the distance represented by arrows 411 is too short. Because there is a cut mask design rule violation, the configuration illustrated in FIG. 4B may merely represent part of the routing flow performed by a routing tool, rather than a finished metal routing layer. Because the routing tool is aware of the cut mask design rules, the routing tool is able to directly modify the cut masks 401 to satisfy the mask design rules.

Figure 4C:
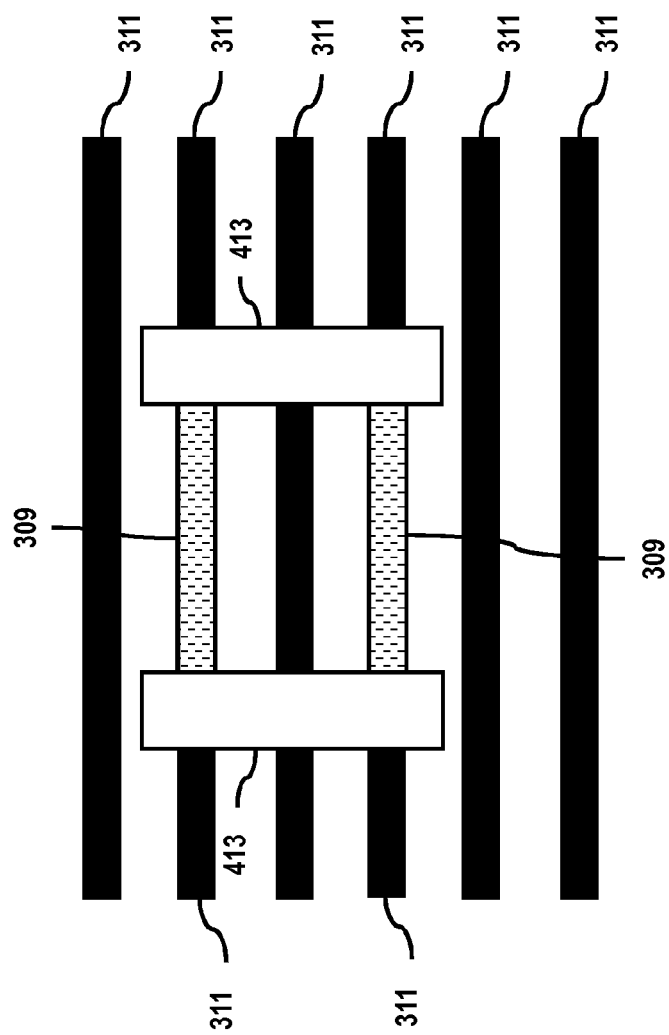

FIG. 4C illustrates a modified routing layer of FIG. 4B that includes modified cut masks 413. The routing tool, after determining a cut mask design rule violation during a design of the routing layer, can modify the cut masks 401 in FIG. 4B to join the nearest cut mask polygons and form modified cut masks 413. Because the distance represented by arrows 411 is removed within the modified routing layer of FIG. 4C, there is no longer a cut mask design rule violation and the metal routing layer of FIG. 4C is manufacturable.

Figure 5:
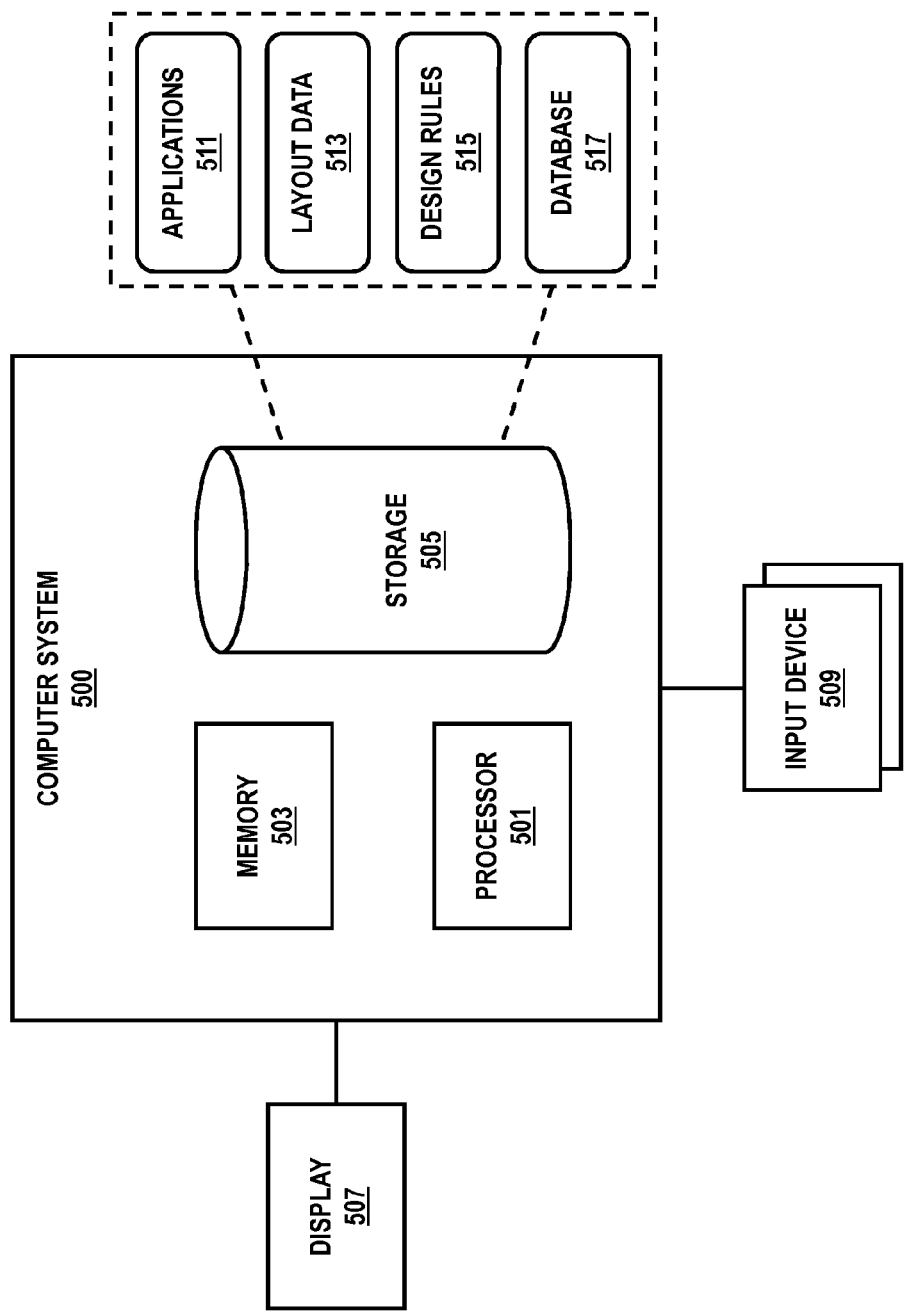
FIG. 5 schematically illustrates a computer system for implementing the processes of FIGS. 2A through 2C, according to an exemplary embodiment.

The processes described herein may be implemented via software, hardware, firmware, or a combination thereof. Exemplary hardware (e.g., computing hardware) is schematically illustrated in FIG. 5. As shown, computer system 500 includes at least one processor 501, at least one memory 503, and at least one storage 505. Computer system 500 may be coupled to display 507 and one or more input devices 509, such as a keyboard and a pointing device. Display 507 may be utilized to provide one or more GUI interfaces. Input devices 509 may be utilized by users of computer system 500 to interact with, for instance, the GUI interfaces. Storage 505 may store applications 511, layout data (or information) 513, mask design rules 515, and at least one mask pattern database (or repository) 517. Applications 511 may include instructions (or computer program code) that when executed by processor 501 cause computer system 500 to perform one or more processes, such as one or more of the processes described herein. In exemplary embodiments, applications 511 may include one or more routing tools.

The embodiments of the present disclosure achieve several technical effects, including eliminating the need for time-consuming decomposition of signal line routing, controlling cut mask patterns used for forming metal routing layers, generating dummy lines during routing eliminating the requirement of post-routing dummy line insertion, and creating a dummy-line-aware timing closure during metal routing. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    laying-out continuous metal lines in a semiconductor design layout;
    routing, by a processor, a metal routing layer using the continuous metal lines according to placement of cut or block masks based on cut or block mask design rules;
    determining locations of the cut or block masks to generate signal lines from the continuous metal lines to connect cells within the semiconductor design layout;
    checking whether the placement of the cut or block masks satisfies the cut or block mask design rules;
    determining that two candidate cut or block mask polygons for routing the metal routing layer would violate the cut or block mask design rules; and
    combining the two candidate cut or block mask polygons into a single cut or block mask polygon to satisfy the cut or block mask design rules.

2. The method according to claim 1, wherein portions of the continuous metal lines used in the metal routing layer form the signal lines, and remaining portions of the continuous metal lines form dummy lines.

3. The method according to claim 2, further comprising:
    accounting for timing delays resulting from the signal lines during the routing.

4. The method according to claim 2, further comprising:
    accounting for timing delays resulting from the dummy lines during the routing to generate a dummy-line-aware timing closure.

5. The method according to claim 1, wherein the cut or block mask design rules are based on proximity of the two candidate cut or block mask polygons.

6. The method according to claim 1, wherein the masks are block masks.

7. The method according to claim 1, wherein the masks are cut masks.

8. An apparatus comprising:
    a processor; and
    a memory including computer program code for one or more programs, the memory and the computer program code configured to, with the processor, cause the apparatus to perform the following:
    layout continuous metal lines in a semiconductor design layout;
    route a metal routing layer using the continuous metal lines according to placement of cut or block masks based on cut or block mask design rules;
    determine locations of cut or block masks to generate the signal lines from the continuous metal lines to connect cells within the semiconductor design layout;
    check whether the placement of the cut or block masks satisfies the cut or block mask design rules
    determine that two candidate cut or block mask polygons for routing the metal routing layer would violate the cut or block mask design rules; and
    combine the two candidate cut or block mask polygons into a single cut or block mask polygon to satisfy the cut or block mask design rules.

9. The apparatus according to claim 8, wherein portions of the continuous metal lines used in the metal routing layer form the signal lines, and remaining portions of the continuous metal lines form dummy lines.

10. The apparatus according to claim 9, wherein the apparatus is further caused to:
    account for timing delays resulting from the signal lines during the routing.

11. The apparatus according to claim 9, wherein the apparatus is further caused to:
    account for timing delays resulting from the dummy lines during the routing to generate a dummy-line-aware timing closure.

12. The apparatus according to claim 8, wherein the cut or block mask design rules are based on proximity of the two candidate cut or block mask polygons.

13. The apparatus according to claim 8, wherein the masks are block masks.

14. The apparatus according to claim 8, wherein the masks are cut masks.

15. A method comprising:
    forming continuous metal lines above a substrate of a semiconductor device;
    determining, by a processor, locations of cut or block masks based on cut or block mask design rules for designing a metal routing layer out of the continuous metal lines;
    removing portions of the continuous metal lines based on the cut or block masks forming the metal routing layer;
    determining locations of the cut or block masks to generate signal lines from the continuous metal lines to connect cells within the semiconductor design layout;
    checking whether the placement of the cut or block masks satisfies the cut or block mask design rules;
    determining that two candidate cut or block mask polygons in designing the metal routing layer would violate a cut or block mask design rule; and
    forming a single cut or block mask polygon by combining the two candidate cut or block mask polygons to satisfy the cut or block mask design rule.

* * * * *